United States Patent [19]

Nagase et al.

[11] Patent Number: 5,309,398
[45] Date of Patent: May 3, 1994

[54] SEMICONDUCTOR MEMORY DEVICE AND METHOD FOR CONTROLLING ITS OUTPUT

[75] Inventors: Koichi Nagase; Akio Nakayama; Tetsuya Aono; Yutaka Ikeda; Yoshinori Mizugai, all of Hyogo, Japan

[73] Assignee: Mitsubishi Denki Kabushiki Kaisha, Tokyo, Japan

[21] Appl. No.: 950,243

[22] Filed: Sep. 24, 1992

[30] Foreign Application Priority Data

Sep. 27, 1991 [JP] Japan .................... 3-249552

[51] Int. Cl.⁵ .............................................. G11C 7/00
[52] U.S. Cl. ............................ 365/189.05; 365/220; 365/233
[58] Field of Search ............... 365/189.05, 233, 220

[56] References Cited

U.S. PATENT DOCUMENTS 4,928,265 5/1990 Higuchi et al. ............... 365/189.05

FOREIGN PATENT DOCUMENTS 64-45932 9/1990 Japan .................... 365/189.05

*Primary Examiner*—Eugene R. LaRoche
*Assistant Examiner*—Andrew Tran
*Attorney, Agent, or Firm*—Lowe, Price, LeBlanc & Becker

[57] ABSTRACT

An upper column address strobe signal and a lower column address strobe signal applied to a dynamic RAM are 180° out of phase from each other. Data of n bits are read out from a memory cell array at a time. The data read out from memory cell array is divided into two bit groups and applied to an upper IO buffer and a lower IO buffer. Upper IO buffer and lower IO buffer latch sequentially the upper bit group and the lower bit group and output these groups to a data transmission bus in response to the upper column address strobe signal and the lower column address strobe signal.

5 Claims, 5 Drawing Sheets

SEMICONDUCTOR MEMORY DEVICE AND METHOD FOR CONTROLLING ITS OUTPUT

BACKGROUND OF THE INVENTION

1. Field of the Invention

The present invention relates generally to a semiconductor memory device and a method of controlling its output, and more specifically, to a semiconductor memory device in which data of a plurality of bits can be read out simultaneously from its memory cell array and a method of controlling its output.

2. Description of the Background Art

Conventionally, when a semiconductor memory device such as a Dynamic Random Access Memory (hereinafter referred to as a DRAM) is connected to a data transmission bus having a different width, how to control output/input of data to/from the semiconductor memory device is a problem.

FIG. 3 is a block diagram showing a conventional DRAM connected to a data transmission bus having a different bit width. In the figure, the bit width of DRAM 1 is selected to be n bits (n is an integer equal to or larger than 2). In other words, DRAM 1 can write and read data of n bits at a time. Data transmission bus 2 connected to DRAM 1 has its bit width selected to be m bits (m=n/2). An output of n bits from DRAM 1 is divided into an upper bit group $BG_U$ of more significant m bits and a lower bit group $BG_L$ of less significant m bits, and the bit groups are each connected to data transmission bus 2. DRAM 1 is supplied with a row address strobe signal $\overline{RAS}$ through an input terminal 3, an upper column address strobe signal $\overline{CAS_U}$ through an input terminal 4, and a lower column address strobe signal $\overline{CAS_L}$ through an input terminal 5. DRAM 1 is also supplied with address data through input terminals 6₁–6k.

DRAM 1 shown in FIG. 3 controls output of the upper bit group $BG_U$ in response to the upper column address strobe signal $\overline{CAS_U}$ and controls output of the lower bit group $BG_L$ in response to the lower column address strobe signal $\overline{CAS_L}$.

FIG. 4 is a timing chart showing the operation of the DRAM shown in FIG. 3 when the upper column address strobe signal $\overline{CAS_U}$ and the lower column address strobe signal $\overline{CAS_L}$ in phase are applied to the DRAM. As shown in the figure, with the upper column address strobe signal $\overline{CAS_U}$ and the lower column address strobe signal $\overline{CAS_L}$ being in phase, an output of the upper bit group $BG_U$ and an output of the lower group $BG_L$ collides with each other on data transmission bus 2.

A conventional approach for preventing the collision of data is to activate one of the upper column address strobe signal $\overline{CAS_U}$ and the lower column address strobe signal $\overline{CAS_L}$ and deactivate the other. For example in FIG. 5, only the upper column address strobe signal $\overline{CAS_U}$ is activated. Only data from the upper bit group $BG_U$ is therefore output onto data transmission bus 2.

When connected to a data transmission bus having a small bit width, a conventional semiconductor memory device structured as described above can output only m-bit data, which is only the half of the output bit width n the semiconductor memory device actually has, and the data transmission rate is therefore low.

SUMMARY OF THE INVENTION

It is therefore an object of the present invention to provide a semiconductor memory device having an improved data transmission rate and a method of controlling its output.

A semiconductor memory device in accordance with the present invention can read data of n (n is an integer equal to or larger than 2) bits at a time from a memory cell array including a plurality of memory cells, and includes selecting means and outputting means. The selecting means selects simultaneously n memory cells in the memory cell array based on externally applied address data. The outputting means divides data of n bits read out from the n memory cells selected by the selecting means into a plurality of bit groups, and outputs the divided bit groups sequentially in response to a plurality of externally applied timing signals.

A method of controlling an output of a semiconductor memory device in accordance with the present invention includes externally applying a plurality of timing signals out of phase from each other, dividing data of n bits read out from a memory cell array into a plurality of bit groups, and outputting the divided groups sequentially in response to the plurality of externally applied timing signals.

In a semiconductor memory device in accordance with the present invention, outputting means divides read data of n bits into a plurality of bit groups, and sequentially outputs the divided bit groups in response to a plurality of externally applied timing signals. Thus, all the data of n bits simultaneously read out from the memory cell array can be output to a data transmission bus in a time-dividing manner, thereby improving the data transmission rate.

According to a method of controlling an output from a semiconductor memory device in accordance with the present invention, similarly, all the data of n bits read out from a memory cell array can be output to a data transmission bus, thereby increasing the data transmission rate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
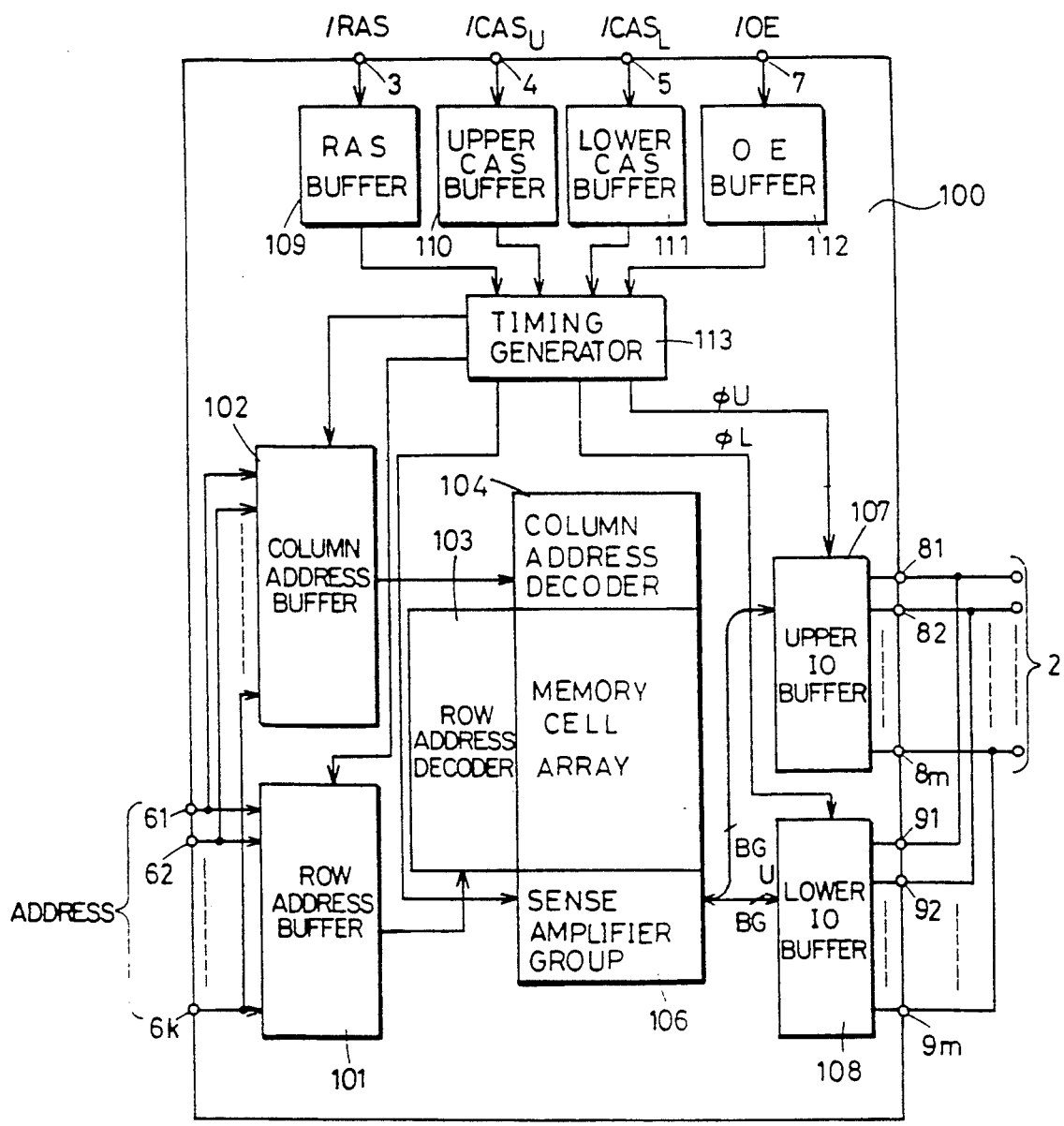
FIG. 1 is a block diagram showing a structure of a DRAM in accordance with one embodiment of the present invention.

FIG. 1 is a block diagram showing a structure of a DRAM in accordance with one embodiment of the present invention. In FIG. 1, DRAM 100 includes a row address buffer 101, a column address buffer 102, a row address decoder 103, a column address decoder 104, a memory cell array 105, a sense amplifier group 106, an upper IO buffer 107, a lower IO buffer 108, an RAS buffer 109, an upper CAS buffer 110, a lower CAS buffer 111, an OE buffer 112, and a timing generator 113.

Address data externally applied to input terminals 61-6k are applied to row address buffer 101 and column address buffer 102. Row address buffer 101 and column address buffer 102 latch row address data and column address data, respectively, in response to timing signals from timing generator 113. The row address data output from row address buffer 101 is applied to row address decoder 103. The column address data output from column address buffer 102 is applied to column address decoder 104.

Memory cell array 105 includes a plurality of word lines, a plurality of bit lines arranged to cross these word lines, and a plurality of memory cells arranged at the cross-over points of the word lines and bit lines. Row address decoder 103 selects a word line in memory cell array 105 based on the row address data applied from row address buffer 101. Column address decoder 104 selects a bit line in memory cell array 105 based on the column address data applied from column address buffer 102. Memory cell array 105 is divided into a plurality of sectors, and corresponding n memory cells in the sectors are selected at a time by row address decoder 103 and column address decoder 104. Sense amplifier group 106 includes a plurality of sense amplifiers provided correspondingly to the bit lines in memory cell array 105.

The data of n bits simultaneously read from memory cell array 105 is amplified by sense amplifier group 106, is then divided into an upper bit group $BG_U$ and a lower bit group $BG_L$, and the groups are applied to upper IO buffer 107 and lower IO buffer 108. Upper IO buffer 107 is provided with the data of more significant m bits among the above-described data of n bits. Lower IO buffer 108 is supplied with the data of less significant m bits among the above-described data of n bits. Upper IO buffer 107 latches the data of more significant m bits in response to a timing signal $\phi U$ applied from timing generator 113. Lower IO buffer 108 latches the data of less significant m bits in response to a timing signal $\phi L$ applied from timing generator 113. Output data from upper IO buffer 107 is fed to data transmission bus 2 through output terminals 81-8m. Output data from lower IO buffer 108 is fed to data transmission bus 2 through output terminals 91-9m.

RAS buffer 109 takes up and holds a row address strobe signal $\overline{RAS}$ received at an input terminal 3. Upper CAS buffer 110 takes up and holds an upper column address strobe signal $\overline{CAS_U}$ received at an input terminal 4. Lower CAS buffer 111 takes up and holds a lower column address strobe signal $\overline{CAS_L}$ received at an input terminal 5. OE buffer 112 takes up and holds an output enable signal $\overline{OE}$ received at an input terminal 7. Timing generator 113 generates various timing signals based on the row address strobe signal $\overline{RAS}$ fed from RAS buffer 109, the upper column address strobe signal $\overline{CAS_U}$ fed from upper CAS buffer 110, the lower column address strobe signal $\overline{CAS_L}$ applied fed from lower CAS buffer 111, and the output enable signal $\overline{OE}$ fed from OE buffer 112. The timing signals generated by timing generator 113 are applied to row address buffer 101, column address buffer 102, sense amplifier group 106, upper IO buffer 107 and lower IO buffer 108.

Row address buffer 101 and column address buffer 102 have their timings of latching the row address data and column address data controlled by the timing signals fed from timing generator 113. Sense amplifier group 106 has its activation/deactivation controlled in response to the timing signals fed from timing generator 113. Upper IO buffer 107 and lower IO buffer 108 have their timings of latching data read out from memory cell array 105 controlled in response to the timing signals $\phi U$ and $\phi L$ fed from timing generator 113.

Figure 2:
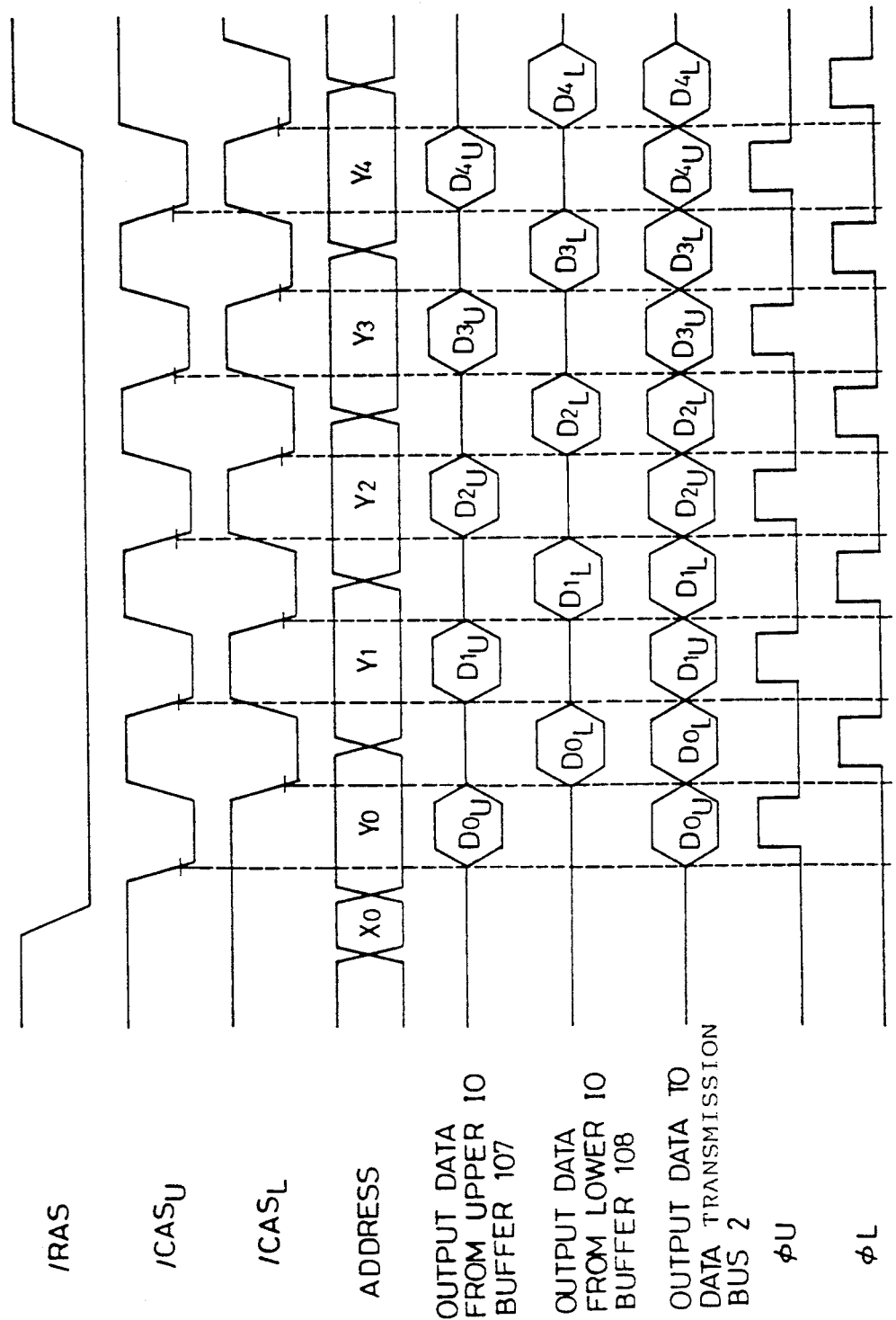
FIG. 2 is a timing chart showing the operation of the semiconductor memory device shown in FIG. 1 in its page mode.

FIG. 2 is a timing chart showing the operation in its page mode in the embodiment shown in FIG. 1. The operation in the page mode will be described for illustrating the operation of the embodiment shown in FIG. 1 in conjunction with FIG. 2.

In the page mode, data for one row in memory cell array 105 is sequentially read out from the end of the row, by changing column addresses sequentially with the row address being fixed. When reading of the data for one row is completed, the row address is updated by one and data in the next row is read out sequentially. FIG. 2 illustrates the operation when data is read out from a certain row in memory cell array 105. The row address strobe signal $\overline{RAS}$ is pulled from H level to L level and activated. The L level state of the row address strobe signal $\overline{RAS}$ is maintained until the end of reading of the data for the one row. Row address buffer 101 latches row address data in response to the rising of the row address strobe signal $\overline{RAS}$. An output from row address buffer 101 is applied to row address decoder 103. Row address decoder 103 selects one word line in memory cell array based on the applied row address data. Thus, data of a memory cell belonging to the selected word line is read out onto a bit line.

The upper column address strobe signal $\overline{CAS_U}$ and the lower column address strobe signal $\overline{CAS_L}$ are 180° out of phase from each other. Column address buffer 102 latches column address data in response to the falling of the upper column address strobe signal $CAS_U$. The column address data latched by column address buffer 102 is applied to column address decoder 104. Column address decoder 104 selects a bit line to which each sector in memory cell array 105 corresponds based on the applied column address data. Thus, the data of n bits read out from corresponding memory cells in each sector in memory cell array 106 is amplified at sense amplifier group 105, and the amplified data is applied to upper IO buffer 107 and lower IO buffer 108. Upper IO buffer 107 latches output data of more significant m bits in response to the timing signal $\phi U$ applied from timing generator 113. Lower IO buffer 108 latches output data of less significant m bits in response to the timing signal $\phi L$ fed from timing generator 113. As shown in FIG. 2, the timing signals $\phi U$ and $\phi L$ are 180° out of phase from each other. Consequently, the data latched by upper IO buffer 107 and the data latched by the lower IO buffer 108 are applied to data transmission bus 2 without overlapping each other.

Figure 3:
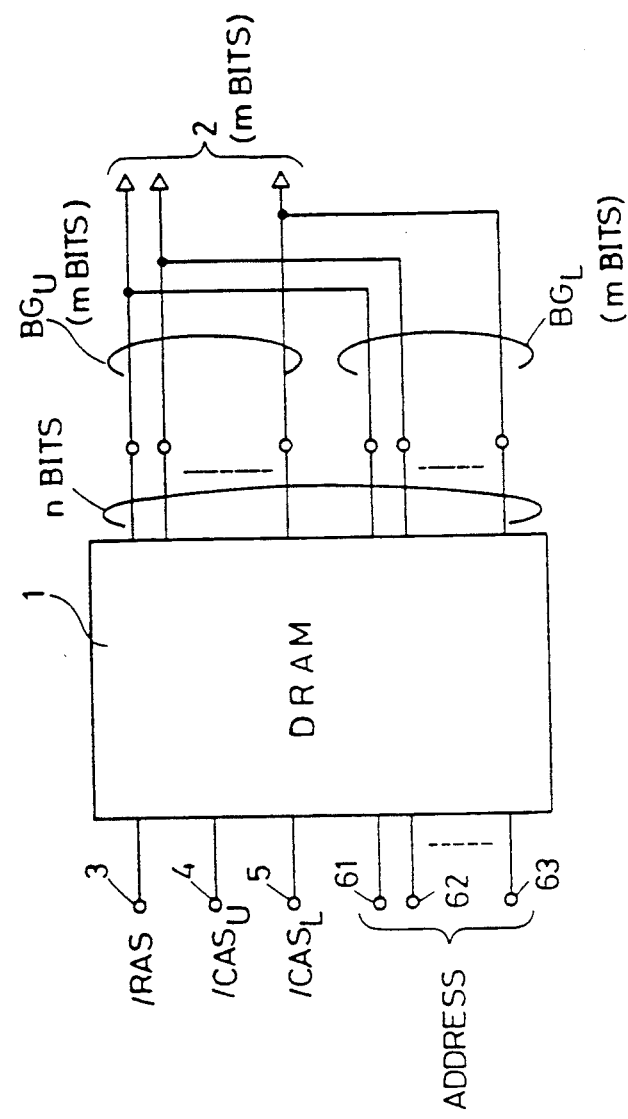
FIG. 3 is a diagram showing a conventional DRAM.
Figure 4:
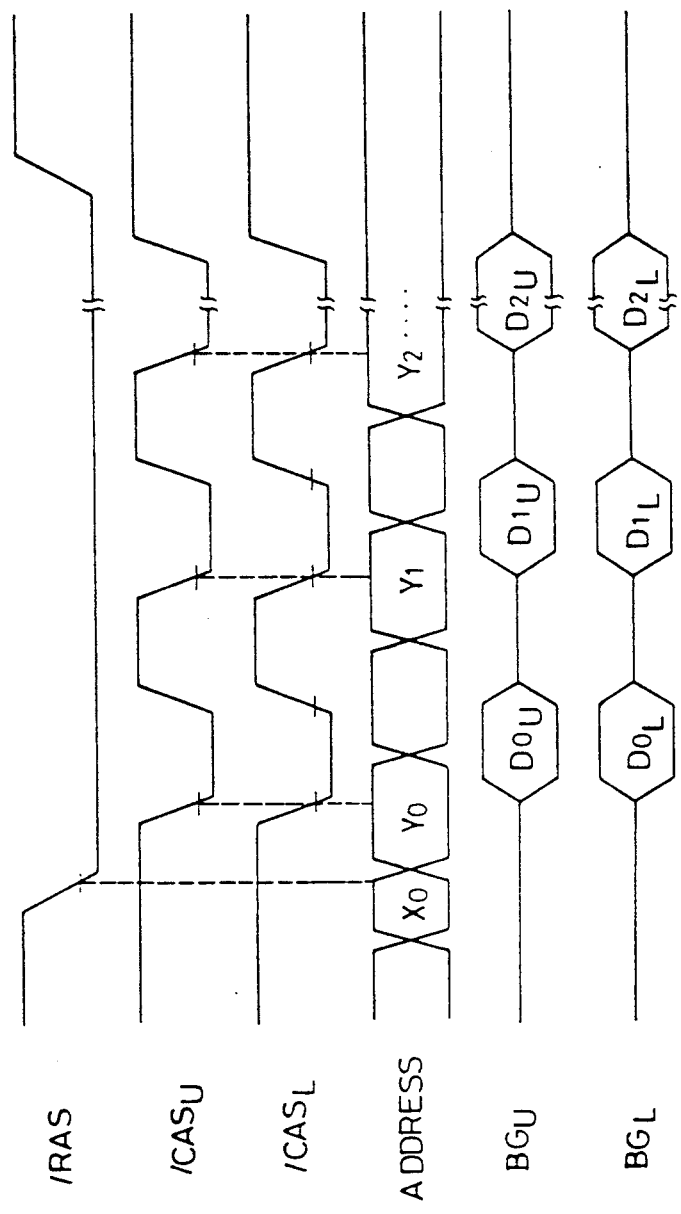
FIG. 4 is a timing chart showing the operation of a conventional DRAM.
Figure 5:
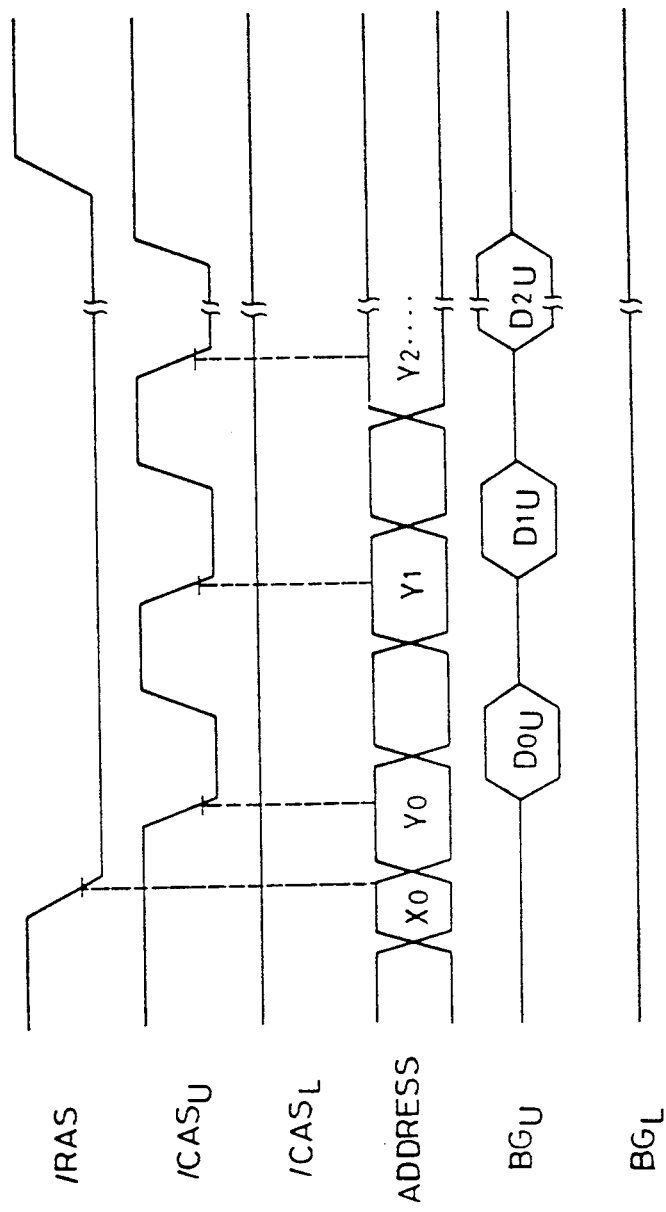
FIG. 5 is a timing chart showing other operations of the conventional DRAM.

As described above, in the embodiment shown in FIG. 1, the data of more significant m bits and the data of less significant m bits among the data of n bits simultaneously read out from memory cell array 105 are transmitted sequentially to data transmission bus 2 without overlapping each other. As a result, a data transmission rate about twice as high as that of the conventional DRAM 1 shown in FIG. 3 can be provided.

The operation in the page mode has been described as an example, but similar effects to the above-described embodiment can be provided in the case of usual read mode if the data of n bits simultaneously read from the memory cell array is divided into a plurality of bit groups and the groups are output sequentially.

Although in the above-described embodiment the data of n bits simultaneously read from memory cell array 105 is divided to two bit groups to be output, the present invention is applicable to the case in which the data of n bits is divided into three or more bit groups to be output.

Also, in the above-described embodiment, the case has been described in which DRAMs are used, the present invention is applicable to other kinds of semiconductor devices such as a static RAM or a nonvolatile semiconductor memory device.

As described above, according to the present invention, data of a plurality of bits simultaneously read out from a memory cell array is divided into a plurality of bit groups, and all the groups can be fed to a data transmission bus, thereby considerably increasing the transmission rate of data compared to a conventional semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device from which data of n (n is an integer equal to or larger than 2) bits can be read out simultaneously from a memory cell array including a plurality of memory cells, comprising:

selection means for simultaneously selecting n memory cells in said memory cell array based on externally applied address data; and outputting means for dividing data of n bits read out from the n memory cells selected by said selection means into a plurality of bit groups and for sequentially outputting the plurality of bit groups in response to a plurality of externally applied timing signals which are out of phase with each other.

2. A semiconductor memory device as recited in claim 1, wherein said plurality of timing signals include first and second column address strobe signals 180° out of phase from each other.

3. A semiconductor memory device as recited in claim 2, wherein said outputting means divides the data of n bits read from out from said memory cell array into a first bit group of more significant n/2 bits and a second bit group of less significant n/2 bits, and outputs said first bit group in response to said first column address strobe signal and said second bit group in response to said second column address strobe signal.

4. A method of controlling output of a semiconductor memory device permitting reading of data of n (n is an integer equal to or larger than 2) bits simultaneously from a memory cell array including a plurality of memory cells, comprising:

a first step of externally applying a plurality of timing signals out of phase from each other to the semiconductor device; and a second step of dividing the data of n bits read out from said memory cell array into a plurality of bit groups and sequentially outputting the divided bit groups in response to said plurality of timing signals.

5. A method of controlling output of a semiconductor memory device as recited in claim 4, wherein said plurality of timing signals include first and second column address strobe signals 180° out of phase from each other, and said second step divides the data of n bits read out from said memory cell array into a first bit group of more significant n/2 bits and a second bit group of less significant n/2 bits, and outputs said first bit group in response to said first column address strobe signal and said second bit group in response to said second column address strobe signal.

* * * * *